United States Patent
Lesso et al.

(10) Patent No.: US 12,451,896 B2
(45) Date of Patent: Oct. 21, 2025

(54) CIRCUITRY FOR MEASUREMENT OF ELECTROCHEMICAL CELLS

(71) Applicant: Cirrus Logic International Semiconductor Ltd., Edinburgh (GB)

(72) Inventors: John P. Lesso, Edinburgh (GB); Ivan Perry, Penicuik (GB); Salvatore Caporale, Edinburgh (GB); Gagan Midha, Edinburgh (GB); James Wells, Edinburgh (GB)

(73) Assignee: Cirrus Logic Inc., Austin, TX (US)

( * ) Notice: Subject to any disclaimer, the term of this patent is extended or adjusted under 35 U.S.C. 154(b) by 114 days.

(21) Appl. No.: 18/454,435

(22) Filed: Aug. 23, 2023

(65) Prior Publication Data

US 2024/0322834 A1    Sep. 26, 2024

Related U.S. Application Data

(60) Provisional application No. 63/491,987, filed on Mar. 24, 2023.

(51) Int. Cl.
*H03M 1/10*    (2006.01)
*H01M 6/02*    (2006.01)
(Continued)

(52) U.S. Cl.
CPC ........... *H03M 1/1009* (2013.01); *H01M 6/02* (2013.01); *H01M 6/5044* (2013.01); *H03M 1/1071* (2013.01); *G01N 27/26* (2013.01)

(58) Field of Classification Search
CPC .... H03M 1/1009; H03M 1/1071; H01M 6/02; H01M 6/5044; G01N 27/26
See application file for complete search history.

(56) References Cited

U.S. PATENT DOCUMENTS 5,873,990 A * 2/1999 Wojciechowski ............................ G01N 33/48714
                                                                                        204/406
2021/0262977 A1    8/2021 Kanoun

FOREIGN PATENT DOCUMENTS

CN    114166905 B    3/2022
WO    2022119546 A2    6/2022

OTHER PUBLICATIONS

Combined Search and Examination Report under Sections 17 and 18(3), UKIPO, Application No. GB2402588.4, dated Dec. 12, 2024.

* cited by examiner

*Primary Examiner* — Joseph J Lauture
(74) *Attorney, Agent, or Firm* — Jackson Walker L.L.P.

(57) ABSTRACT

Circuitry for processing an analyte signal obtained from an electrochemical cell, the circuitry comprising: measurement circuitry having a first measurement input coupled to a first electrode of the electrochemical cell, the measurement circuitry configured to convert the analyte signal at the first measurement input to a first analog output signal; an analog-to-digital converter (ADC) having an first ADC input for receiving the first analog output signal, the ADC configured to convert the first analog output signal to a first digital output signal at an ADC output; compensation circuitry configured in a measurement mode to: apply a first compensation to the first digital output signal to obtain a first compensated digital output signal, the first compensation to compensate for non-linearity in the ADC; and apply a second compensation to the first compensated digital output signal to obtain a second compensated digital output signal, the second compensation to compensate for non-linearity in the measurement circuitry; control circuitry configured in a calibration mode to: apply a first calibration signal at the first ADC input and adapt the first compensation based on the (Continued)

first calibration signal and the first compensated digital output signal; and apply a second calibration signal at the first electrode and adapt the second compensation based on the second calibration signal and the second compensated digital output signal.

20 Claims, 8 Drawing Sheets

(51) Int. Cl.
    *H01M 6/50*     (2006.01)
    *G01N 27/26*     (2006.01)

CIRCUITRY FOR MEASUREMENT OF ELECTROCHEMICAL CELLS

The present disclosure claims priority to U.S. Provisional Patent Application Ser. No. 63/491,987, filed Mar. 24, 2023, which is incorporated by reference herein in its entirety.

TECHNICAL FIELD

The present disclosure relates to circuitry for measuring characteristics in electrochemical cells.

BACKGROUND

Electrochemical sensors are widely used for the detection or characterisation of one or more particular chemical species, analytes, as an oxidation or reduction current. Such sensors comprise an electrochemical cell, consisting of two or more electrodes configured for contact with an analyte whose concentration is to be ascertained. Such sensors also comprise circuitry for driving one or more of the electrodes and for measuring a response signal at one or more of the electrodes. The measured response signal can be processed to determine a concentration of an analyte.

Error can be introduced in the measured response, due to non-ideal effects at the electrochemical cell as well as sub-optimal conditions in circuitry used to measure the response.

SUMMARY

According to a first aspect of the disclosure, there is provided circuitry for processing an analyte signal obtained from an electrochemical cell, the circuitry comprising: measurement circuitry having a first measurement input coupled to a first electrode of the electrochemical cell, the measurement circuitry configured to convert the analyte signal at the first measurement input to a first analog output signal; an analog-to-digital converter (ADC) having an first ADC input for receiving the first analog output signal, the ADC configured to convert the first analog output signal to a first digital output signal at an ADC output; compensation circuitry configured in a measurement mode to: apply a first compensation to the first digital output signal to obtain a first compensated digital output signal, the first compensation to compensate for non-linearity in the ADC; and apply a second compensation to the first compensated digital output signal to obtain a second compensated digital output signal, the second compensation to compensate for non-linearity in the measurement circuitry; control circuitry configured in a calibration mode to: apply a first calibration signal at the first ADC input and adapt the first compensation based on the first calibration signal and the first compensated digital output signal; and apply a second calibration signal at the first electrode and adapt the second compensation based on the second calibration signal and the second compensated digital output signal.

The measurement circuitry may comprise a transimpedance amplifier. The transimpedance amplifier may comprise: a gain stage coupled between the first electrode and the first ADC; and a feedback resistor coupled between the first electrode and the first ADC.

Additionally or alternatively, the measurement circuitry may comprise a current conveyer.

In the measurement mode, the first and second compensations are preferably fixed. For example, the first and second compensations may be calibrated periodically between periods of measurements. Calibration may occur periodically or in response to a determination that a fault or error may be present in the circuitry or cell.

The control circuitry may comprise a first digital-to-analog converter (DAC), which may be configured to apply the first calibration signal and may further comprise a second DAC to apply the second calibration signal. Alternatively, a single DAC may be provided which may be multiplexed to provide both of the first and second calibration signals. The first and/or second DACs may be current DACs. In which case, the first and second calibration signals will be currents.

In some embodiments, in the measurement mode, the first and second DACs may be disabled so as to reduce power consumption of the circuitry.

The circuitry may further comprise: switching circuitry coupled between the first electrode and the first measurement input, the switching circuitry configured to selectively couple the first electrode to one of the first measurement input and a reference voltage. In the measurement mode, the switching circuitry may be configured to couple the first electrode to the first measurement input. In the calibration mode, the switching circuitry may be configured to couple the first electrode to the reference voltage. The reference voltage may be set to maintain a substantially constant voltage at the first electrode during transition between the measurement mode and the calibration mode.

The control circuitry may be configured to: apply the first calibration signal at the first ADC input and adapt the first compensation based on the first calibration signal and the first compensated digital output signal in a first calibration phase; and apply the second calibration signal at the first electrode and adapt the second compensation based on the second calibration signal and the second compensated digital output signal, the first and second calibration phases occurring at different times.

According to another aspect of the disclosure, there is provided circuitry for characterising an electrochemical cell, the circuitry comprising: measurement circuitry; switching circuitry configured to selectively couple the measurement circuitry to respective first and second working electrodes of the electrochemical cell; and calibration circuitry; wherein, in a first mode, the switching circuitry is configured to hold the first and second working electrodes at respective first and second bias voltages and calibration circuitry is configured to calibrate the measurement circuitry, wherein, in a second mode, the switching circuitry is configured to hold the first working electrode at the first bias voltage and couple the second working electrode to the measurement circuitry, and the measurement circuitry is configured to measure a second signal at the second working electrode, and wherein, in a third mode, the switching circuitry is configured to hold the second working electrode at the second bias voltage and couple the first working electrode to the measurement circuitry, and the measurement circuitry is configured to measure a second signal at the second working electrode.

The measurement circuitry may be configured to: convert the first signal at the first working electrode to a first analog output signal; and convert the second signal at the first working electrode to a second analog output signal.

The measurement circuitry may comprise: an analog-to-digital converter (ADC) having a first ADC input for receiving the first analog output signal and a second ADC input for receiving the second analog output signal, the ADC configured to convert the first analog output signal to a first digital output signal and convert the second analog output signal to a second digital output signal.

The measurement circuitry may comprise: a multiplexer having: a first input for receiving the first analog output signal; a second input for receiving the second analog output signal; and a multiplexer output for outputting the first analog output signal or the second analog output signal in response to a select signal; and an analog-to-digital converter (ADC) having a first ADC input coupled to the multiplexer output, the ADC configured to convert the first analog output signal or the second analog output signal to a digital output signal.

The electrochemical cell may comprise a counter electrode and a first working electrode, the first electrode being the first working electrode of the electrochemical cell. The electrochemical cell may further comprise a second working electrode.

Alternatively, the electrochemical cell may comprise an anode and a cathode, the first electrode being the cathode.

The electrochemical cell may comprise one of an amperometric sensor, a potentiometric sensor, and a battery. The amperometric sensor may comprise a potentiostat, wherein the first electrode comprises a working electrode of the potentiostat, and wherein at least one second electrode is provided with the electrochemical cell which comprises a counter electrode of the potentiostat.

According to another aspect of the disclosure, there is provided a system comprising: the circuitry as described above; and the electrochemical cell.

According to another aspect of the disclosure, there is provided a battery, comprising the system or cell described above.

According to another aspect of the disclosure, there is provided an electronic device, comprising the circuitry or any of the systems described above.

The device may comprise one of an analyte monitoring device or an analyte sensing device, a battery, a battery monitoring device, a mobile computing device, a laptop computer, a tablet computer, a games console, a remote control device, a home automation controller or a domestic appliance, a toy, a robot, an audio player, a video player, or a mobile telephone, and a smartphone.

According to another aspect of the disclosure, there is provided a method of processing an analyte signal obtained from an electrochemical cell, the method comprising: measurement circuitry having a first measurement input coupled to a first electrode of the electrochemical cell, the measurement circuitry configured to convert the analyte signal at a first electrode of the electrochemical cell to a first analog output signal; convert the first analog output signal to a first digital output signal; in a measurement mode to: apply a first compensation to the first digital output signal to obtain a first compensated digital output signal, the first compensation to compensate for non-linearity in the ADC; and apply a second compensation to the first compensated digital output signal to obtain a second compensated digital output signal, the second compensation to compensate for non-linearity in the measurement circuitry; and in a calibration mode to: apply a first calibration signal to the first analog output signal and adapt the first compensation based on the first calibration signal and the first compensated digital output signal; and apply a second calibration signal to the first analog output signal and adapt the second compensation based on the second calibration signal and the second compensated digital output signal.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

BRIEF DESCRIPTION OF DRAWINGS

Embodiments of the present disclosure will now be described by way of non-limiting examples with reference to the drawings, in which.

DESCRIPTION OF EMBODIMENTS

Embodiments of the present disclosure relate to the measurement of signals (such as analyte signals) in electrochemical cells.

Figure 1:
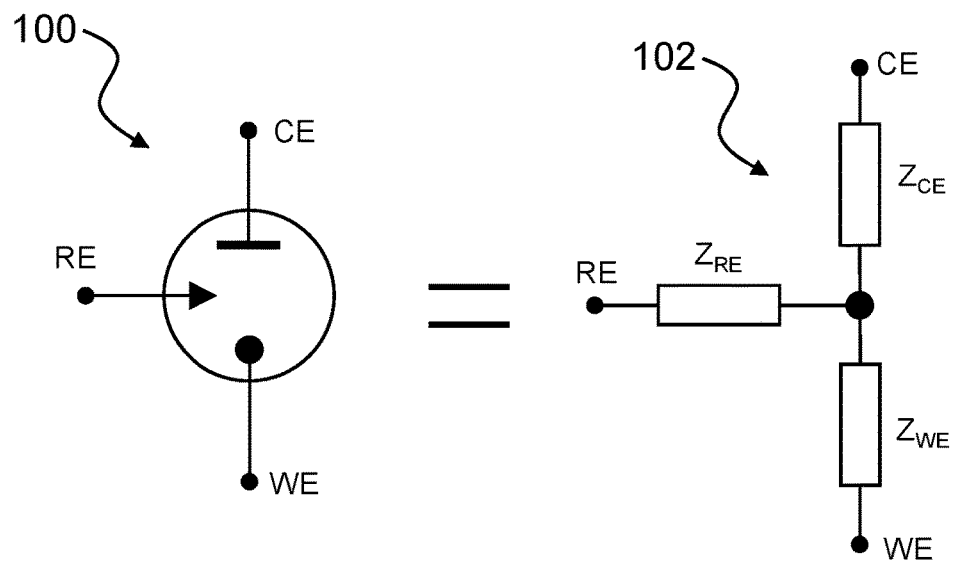
FIG. 1 illustrates a schematic diagram and electrical equivalent circuit for a three-electrode electrochemical cell.

FIG. 1 is a schematic diagram of an electrochemical cell 100 comprising three electrodes, namely a counter electrode CE, a working electrode WE and a reference electrode RE. FIG. 1 also shows an equivalent circuit 102 for the electrochemical cell comprising a counter electrode impedance ZCE, a working electrode impedance ZWE and a reference electrode impedance ZRE.

To determine a characteristic of the electrochemical cell, and therefore an analyte concentration, a bias voltage is applied at the counter electrode CE and a current at the working electrode is measured. Feedback is used to set the voltage VRE at the reference electrode RE to be equal to a bias voltage VBIAS1 (as is explained in more detail below). A current IWE at the working electrode WE is then measured. As the resistance in the cell 100 increases, the current measured at the working electrode WE decreases. Likewise, as the resistance in the cell 100 decreases, the current measured at the working electrode WE increases. Thus the electrochemical cell 100 reaches a state of equilibrium where the voltage drop between the reference electrode RE and the working electrode WE is maintained constant. Since the bias voltage at the counter electrode CE and the measured current at WE are known, a characteristic of the analyte contained in the cell 100 can be ascertained.

Figure 2:
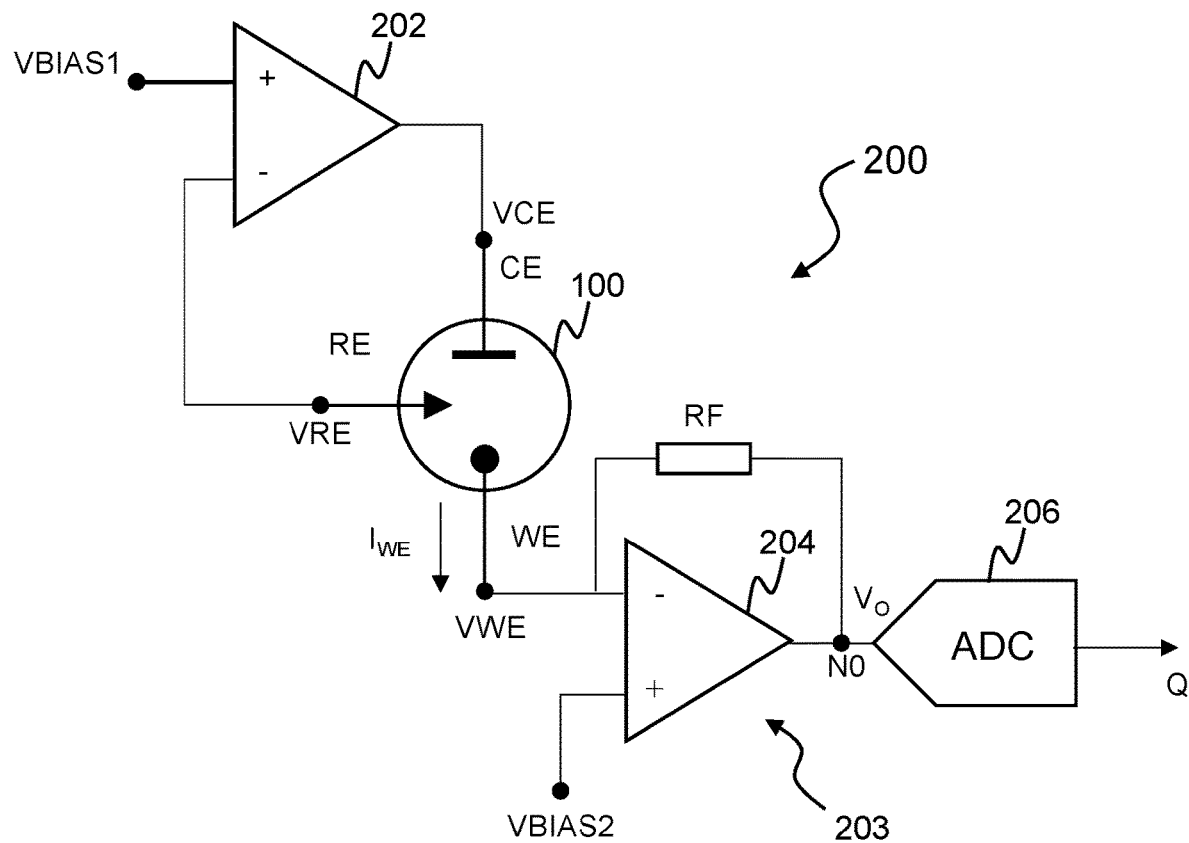
FIG. 2 is a schematic diagram of an example prior art measurement circuit.

FIG. 2 illustrates an example prior art drive and measurement circuit 200 which is configured to implement the above explained cell characterisation, specifically for measuring an analyte concentration in the electrochemical cell 100 shown in FIG. 1. The circuit 200 comprises a first amplifier 202 and a gain stage 203 comprising a second amplifier 204 and a feedback resistor RF. Each of the first and second amplifiers 202, 204 may comprise one or more op-amps. A non-inverting input of the first amplifier 202 is coupled to a bias voltage VBIAS1. An inverting input of the first amplifier 202 is coupled to the reference electrode RE. An output of the first amplifier 202 is coupled to the counter electrode CE and configured to drive the counter electrode CE with a counter electrode bias voltage VCE. The counter electrode bias voltage VCE applied at the counter electrode CE by the first amplifier 202 is proportional to the difference between the bias voltage VBIAS1 and the voltage VRE at the reference electrode RE. As such, the first amplifier 202 acts to maintain the voltage at the reference electrode RE at the bias voltage VBIAS1.

An inverting input of the second amplifier 204 is coupled to the working electrode WE and the non-inverting input of the second amplifier 204 is coupled to a reference voltage, VBIAS2. VBIAS2 may be set to a constant reference voltage, such as half the supply voltage of the circuit 200 (i.e., VDD/2). Alternatively, VBIAS2 may be variable. By controlling the bias voltage VBIAS1 and the reference voltage VBIAS2, a differential bias voltage between the working and reference electrodes WE, RE can be controlled. A feedback loop comprising a feedback resistor RF is coupled between the inverting input and an output of the second amplifier 204. As such, the gain stage 203 operates as a transimpedance amplifier (TIA). The feedback serves to maintain the working electrode WE at the reference voltage VBIAS2 provided at the non-inverting input of the second amplifier 204. The gain stage 203 is thus operable to output an output voltage VO at an output node NO which is proportional to the current IWE at the working electrode WE. The output voltage VO is then provided to an analog-to-digital converter (ADC) 206 which outputs a digital output Q which represents the current IWE at the working electrode WE. As will be explained in more detail below, alternative gain arrangements to that shown in FIG. 2 exists for processing the working electrode current IWE. The arrangements shown in FIG. 2 is provided for example only.

To bias the counter electrode CE, and therefore the electrochemical cell 100, at different voltages, the bias voltage VBIAS1 may be adjusted, for example between ground (e.g. zero volts) and the supply voltage VDD. As an example, with the non-inverting input voltage VBIAS2 of the second amplifier 204 set at VDD/2, a positive bias may be applied to the cell 100 by maintaining the bias voltage VBIAS1 above VDD/2. Likewise, a negative bias may be applied to the cell 100 by maintaining the bias voltage VBIAS1 below VDD/2. Additionally or alternatively to varying the bias voltage VBIAS1, the reference voltage VBIAS2 may be adjusted to set the voltage at the working electrode WE, and therefore the electrochemical cell 100.

It will be appreciated that the ADC 206 has a finite dynamic range and fluctuations in the working electrode current IWE may cause the output voltage VO provided to the ADC 206 to fall outside of this dynamic range. To prevent the output voltage VO provided at the input of the ADC 206 extending outside of this dynamic range, adjustments can be made to the circuit 200. For example, the gain of the second amplifier 204 can be varied, for example by varying the resistance of the feedback resistor RF. However, such adjustments can lead to non-linearity in the gain stage 203.

Figure 3:
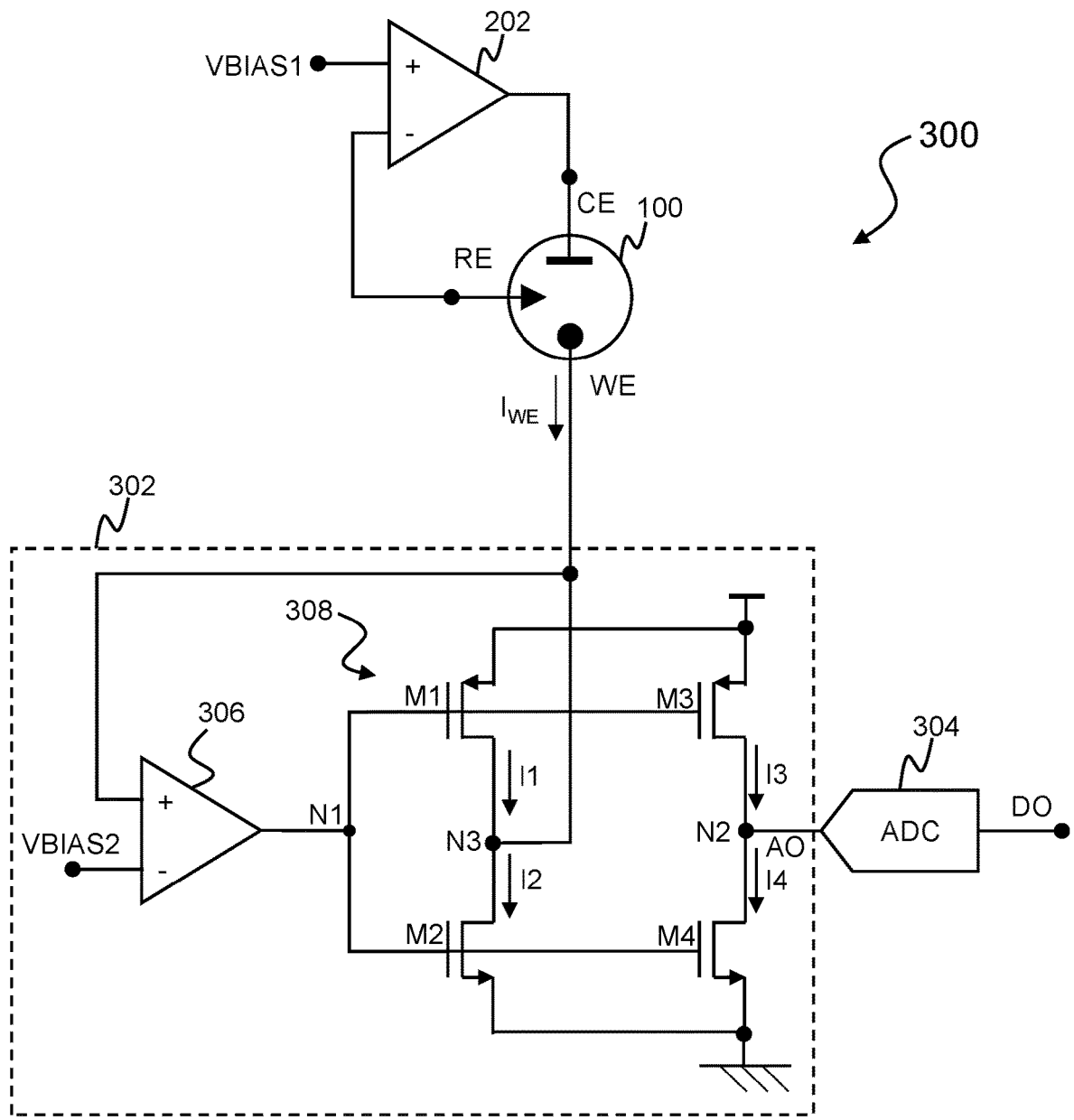
FIG. 3 is a schematic diagram of a measurement circuit for measuring characteristics of an electrochemical cell.

FIG. 3 illustrates another example prior art drive and measurement circuit 300 which implements an alternative measurement regime to the drive and measurement circuit 200 shown in FIG. 2. Common parts of the circuits 200, 300 of FIGS. 2 and 3 denoted with common reference numerals.

Like the circuit 200, the circuit 300 comprises the first amplifier 202 having a non-inverting input coupled to a bias voltage VBIAS1 and an inverting input coupled to the reference electrode RE. The output of the first amplifier 202 is coupled to the counter electrode CE and configured to drive the counter electrode CE with a counter electrode bias voltage VCE. The counter electrode bias voltage VCE applied at the counter electrode CE by the first amplifier 202 is proportional to the difference between the bias voltage VBIAS1 and the voltage VRE at the reference electrode RE.

The circuit 300 further comprises a measurement circuit 302 and an ADC 304. The measurement circuit 302 is implemented as a current conveyor. In this example, the measurement circuit 302 implements a second generation current conveyor (CCII) although other current conveyor topologies could be implemented without departing from the scope of the present disclosure. The measurement circuit 302 comprises a second amplifier 306 (e.g., an operational amplifier) and current mirror circuitry 308 comprising first, second, third and fourth transistors M1, M2, M3, M4. In this example, the transistors M1:M4 are MOSFETs. Specifically, the first and third transistors M1, M3 are PMOS devices and the second and fourth transistors M2, M4 are NMOS devices.

The second amplifier 306 comprises a non-inverting input coupled to the working electrode WE, an inverting input coupled to a reference voltage VBIAS2 and an output coupled to a first (intermediate) node N1.

Gates of each of the first, second, third and fourth transistors M1:M4 are coupled to the first node N1 and therefore the output of the second amplifier 306. Drains of the first and third transistor M1, M3 are coupled to a supply voltage VDD. Sources of the first and third transistors M1, M3 are coupled to drains of the second and fourth transistors M2, M4, respectively. Sources of the second and fourth transistors M2, M4 are coupled to a ground reference voltage (GND). The source of the third transistor M3 and the drain of the fourth transistor M4 are coupled at a second (output) node N2 to an input of the ADC 304. The source of the first transistor M1 and the drain of the second transistor M2 are coupled at a third (feedback) node N3 to the working electrode WE. As such, a feedback path is provided between the third node N3 and the non-inverting input of the second amplifier 306. The amplifier 306 is thus arranged as a unity gain amplifier or buffer amplifier. The first and second transistors M1, M2 operate as transconductors which generate first and second currents I1, I2 respectively. The working electrode current IWE is equal to the difference between the first and second currents (IWE=I2−I1). The first and second transistors M1, M2 act as input reference devices of a current mirror. The third and fourth transistors M3, M4 operate as output devices of the current mirror. The first current I1 is mirrored to a third current I3 generated by the third transistor N3. The second current I2 is mirrored to a fourth current I4 generated by the fourth transistor N4.

During operation, the working electrode current IWE is provided to the second amplifier 306 and this current IWE is amplified by unity and therefore buffered to the first node N1. During operation, the second amplifier 306 amplifies the difference between the working electrode voltage VWE and the reference voltage VBIAS2. Combined with the negative feedback from the third node N3, the result is that the error voltage VWE−VBIAS2 becomes zero such that VBIAS2 and VWE become equal. Respective first and second currents I1, I2 are copied as respective third and fourth currents I3, I4 such that the analog output signal AO is a copy of the current IWE. The ADC 304 is thus configured as a current ADC (IADC) configured to output a digital output signal DO proportional to the current received from the second node N2.

The current conveyor implemented by the measurement circuit 302 of FIG. 3 has an advantage of ensuring low output impedance (when compared to the circuit 200) at each of the counter, reference and working electrodes CE, RE, CE, since the working electrode WE is driven directly by the first and second transistors M1, M2. Since the load across the electrochemical cell 100 is highly capacitive in nature, this inherent low output impedance may be advantageous when a stimulus of high amplitude and/or frequency is driven over the electrochemical cell 100. A drawback of the circuit 300 of FIG. 3 is that any errors in gain between the current mirror input (comprising first and second transistors M1, M2) and the current mirror output (comprising third and fourth transistors M3, M4) can lead to errors in the analog output signal AO. Such errors may include one or more of DC offset error, non-linearity, gain error and additive noise. Such errors are exacerbated when amplifiers have limited gain bandwidth (as is often the case in low power applications). The measurement circuit 302 tends to operate more accurately at high bandwidths. Such high bandwidths may be at frequencies up to 100 kHz, or up to 200 kHz, or up to the megahertz range.

Both of the arrangements shown in FIG. 3 may suffer from the effects of the likes of distortion, mismatch, package stress and/or aging for example, which may lead to non-linearities in operation of the described circuits 200, 300.

Embodiments of the present disclosure aim to address or at least ameliorate one or more of these issues by compensating output signals to linearise any non-linearities present in those signals due to one or more of gain error, distortion, mismatch, package stress and/or aging of circuit elements used to characterise an electrochemical cell.

Figure 4:
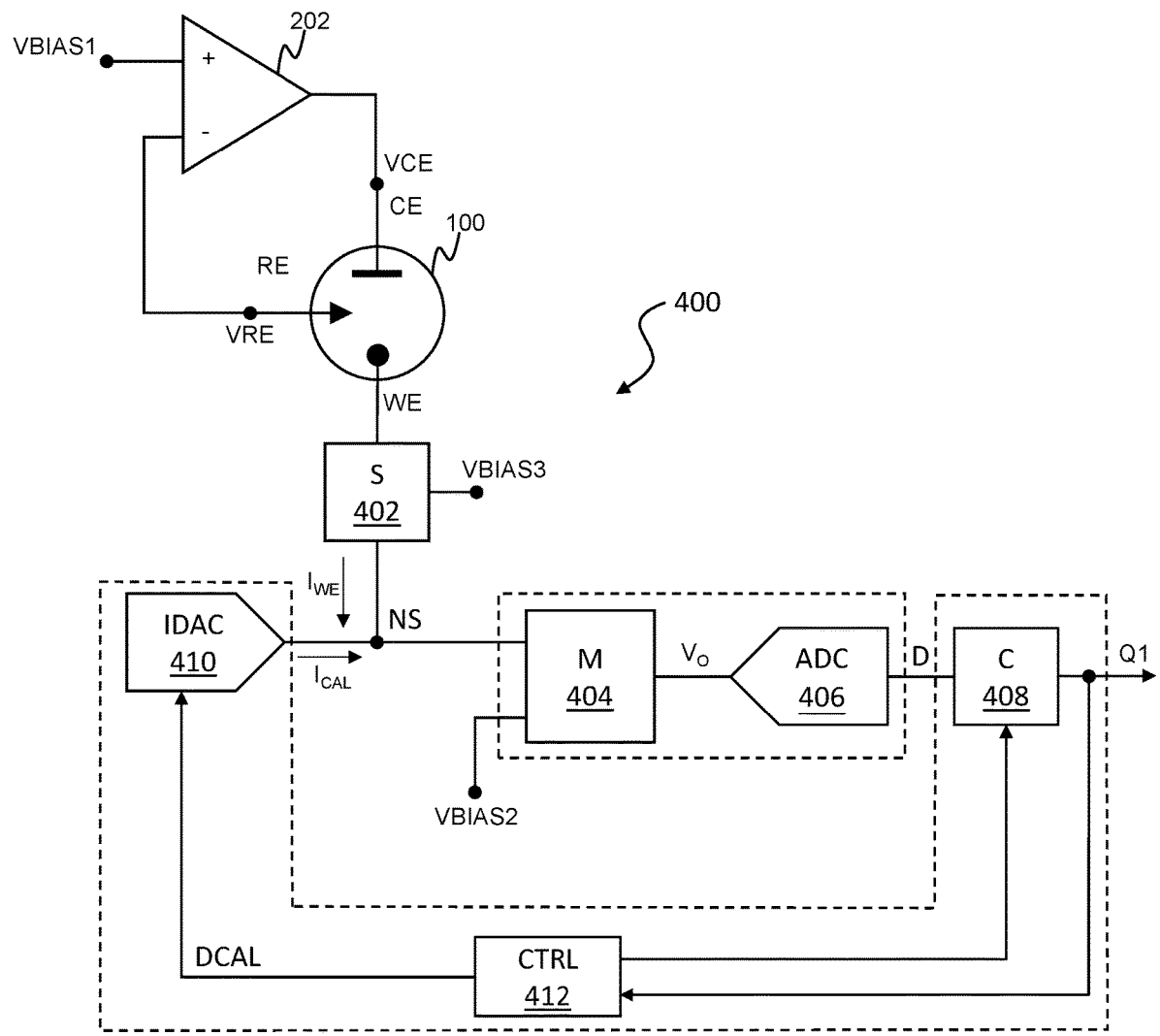
FIG. 4 is a schematic diagram of a measurement circuit for measuring characteristics of an electrochemical cell.

FIG. 4 illustrates an example drive and measurement circuit 400 according to embodiments of the present disclosure. Like parts of the circuit 400 which are common to the circuits 200, 300 of FIGS. 2 and 3 have been denoted like numbering. As such, like the circuit 200 of FIG. 2, the circuit 400 shown in FIG. 3 comprises the electrochemical cell 100 and the first amplifier 202 for biasing the counter electrode CE of the electrochemical cell 100.

The circuit 400 further comprises switching circuitry 402, a measurement circuit 404, an ADC 406, a compensation circuit 408, a current digital-to-analog converter (IDAC) 410 and a control module 412.

The switching circuitry 402 (which may optionally be omitted) is configured to selectively couple the working electrode WE to either a bias voltage VBIAS3 or a sense node NS. The switching circuitry 402 may be controlled by the control module 412 or other control circuitry. To which of the bias voltage VBIAS3 and the sense node NS the switching circuitry is connected may depend on a mode of operation of the circuit 400, as will be explained in more detail below.

The measurement circuit 404 comprises first and second inputs and an output. The first input of the measurement circuit 404 is coupled to the sense node NS (which itself is selectively coupled to the working electrode WE via the switching circuitry 402). The second input is coupled to a bias voltage VBIAS2 which sets the voltage at the sense node NS. The output is coupled to an input of the ADC 406.

In some embodiments, the measurement circuit 404 may comprise the gain stage 203 of FIG. 2. In which case, the first input is the non-inverting input of the gain stage 203, the second input is the inverting input of the gain stage 203, and the output is the output N0 of the gain stage 203. Such an implementation is shown in detail in FIG. 5.

In some embodiments, the measurement circuit 404 may comprise the current conveyor 302 of FIG. 3. In which case, the first input is coupled to the non-inverting input of the amplifier 306, the second input is coupled to the inverting input of the amplifier 306, and the output is couple to the second node N2 of the current conveyor 302. Such an implementation is shown in detail in FIG. 6.

Referring again to FIG. 4, in some embodiments, the measurement circuit 404 may be implemented using another conceivable measurement topology in which a voltage (or other signal) is output which corresponds to a current IWE at the sense node NS. In any case, it will be appreciated that the measurement circuit 404 is subject to various effects which lead to non-linearities in the output voltage VO output from the measurement circuit 404.

The ADC 406 is configured to generate a digital representation D of the voltage VO. This digital representation D is output to the compensation circuit 408.

In some embodiments, the measurement circuit 404 may be omitted altogether the input of the ADC 406 may be coupled directly to the sense node NS. For example, the ADC 406 may be implemented as a current DAC (IDAC) configured to convert a current at the sense node to the digital representation D.

The compensation circuit 408 may be configured to apply compensation to the digital representation D. The compensation circuit 408 may be configured to apply compensation to linearise non-linearities in the digital representation D present due to non-linear behaviour of the measurement circuit 404 and/or the ADC 406, as will be explained in more detail below. The compensation circuit 408 may comprise one or more filters (e.g. adaptive filters) and/or one or more optimisers. For example, the compensation circuit 408 may be configured to implement a normalised least-mean-square (NLMS) algorithm of filter. For example, the compensation circuit 408 may comprise a filter configured to implement a polynomial, for example:

$$y(x) = \sum_{K=0}^{K+1} Pkx^k$$

In some examples, the compensation circuit 408 may implement a NLMS filter constructed based on from orthogonal polynomials, such as Legendre or Chebyshev polynomials. The compensation circuit 408 may have a transfer function between its input and output which may have memory or may be memoryless. In some examples, the compensation circuit 408 may be implemented as a neural network, which may be trained with data associated with the measurement circuit and/or the ADC 406. The compensation applied by the compensation circuit 408 may be a function of one or more of the output of the ADC 406, the bias voltage VBIAS2 applied at the second input of the measurement circuit 404 and/or a temperature at the circuit 400 and/or cell 100.

The compensation circuit 408 may be controlled by the control module 412 using one or more control signals. The control module 412 may be operable to enable and/or disable the compensation circuit 408, for example. This may occur, for example, where a working electrode voltage VWE is outside of a predetermined threshold limit or range. The control module 412 may be configured to adjust or adapt the compensation applied by the compensation circuit 408. Such adaptation may take place dynamically or periodically, for example during a calibration mode in which the measurement circuit 404 and/or the ADC 406 is characterised.

An output of the IDAC 410 is coupled to the sense node NS. Thus, the IDAC 410 may be configured to inject a calibration current ICAL into the measurement circuit 404. The calibration current ICAL may be set by an input signal DIN The IDAC 410 may be controlled by the control module 412. The control module 412 may be configured both to enable the IDAC 410 and control the calibration current ICAL injected by the IDAC 410.

The circuit 400 may be operably in a measurement mode and a calibration mode. In a measurement mode, the circuit 400 may operate to characterise the cell 100, e.g. determine one or more properties of or characteristics of the cell 100. In the calibration mode, a calibration current ICAL may be injected into a signal path comprising the measurement circuit 404 and the ADC 406 to determine one or more characteristics of the signal path (i.e. the measurement circuit 404 and/or the ADC 406).

Figure 7:
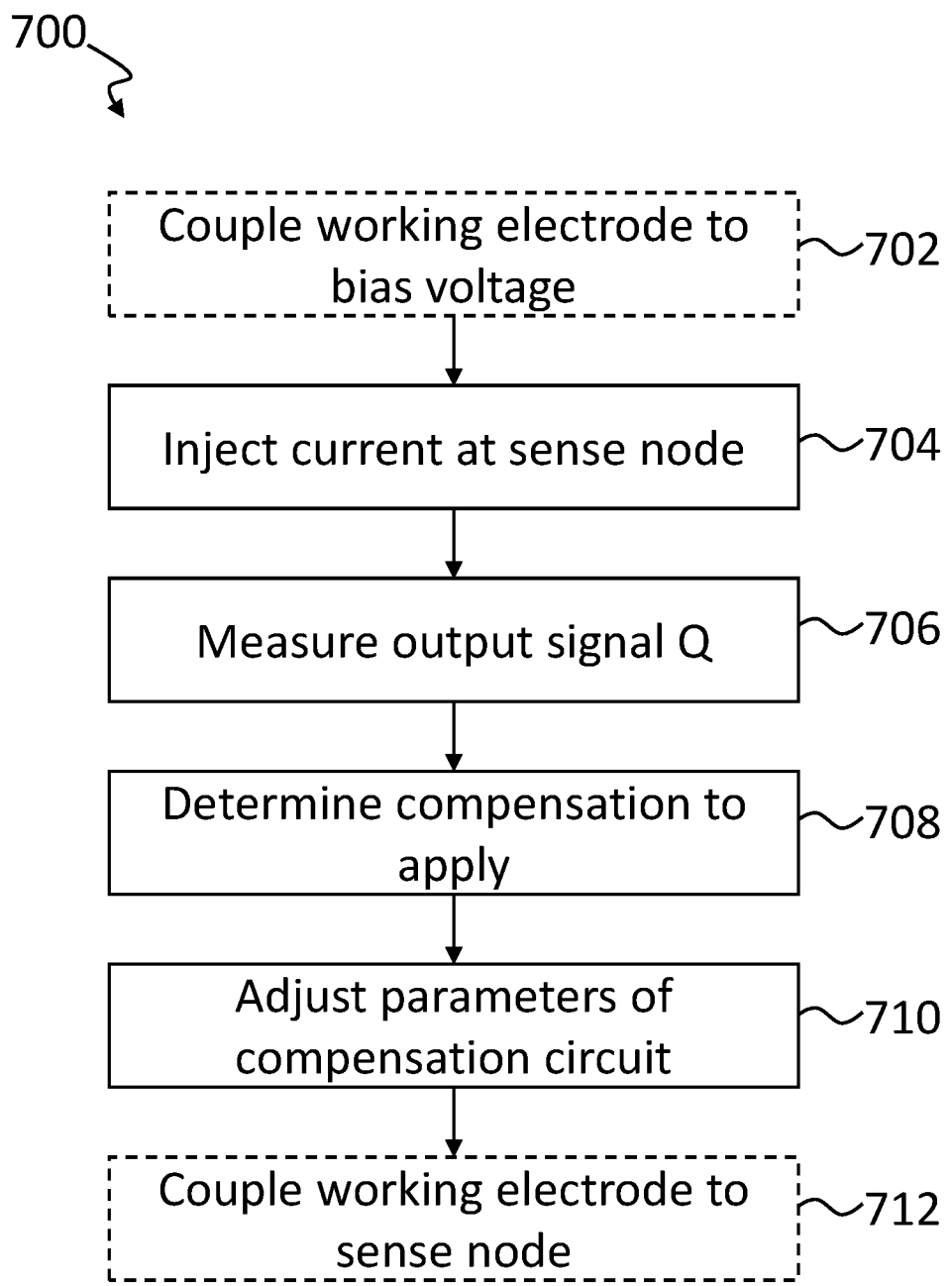
FIG. 7 is a flow diagram for an example calibration process implemented by the circuit of FIG. 4.

FIG. 7 is a flow diagram for an example calibration process 700 implemented by the circuit 400 of FIG. 4.

Optionally, at step 702, the switching circuitry 402 may be controlled to disconnect the working electrode WE of the cell 100 from the sense node and connect the working electrode WE to the bias voltage VBIAS3. The bias voltage VBIAS3 may be set to the same voltage as that at the sense node NS before switching connection of the working electrode WE. For example, the bias voltage VBIAS3 may be equal to the bias voltage VBIAS2 applied at the second input of the measurement circuit 403. In doing so, the switching circuitry 402 allows for the signal path through the measurement circuit 404 and the ADC 406 to be characterised whilst maintaining the bias across the cell 100 substantially constant. Preferably, switching circuitry 402 operates as a make-before-break switch network. In other words, the switching circuitry 402 may be configured to first connect the working electrode WE to the bias voltage VBIAS3 before disconnecting the working electrode WE from the sense node NS. Thus, for a short time, the working electrode may be coupled to both the bias voltage VBIAS3 and the sense node NS.

At step 704, with the working electrode WE preferably decoupled from the signal path comprising the measurement circuit 404 and the ADC 406, the IDAC 410 may be controlled by the control module 412 to inject a known calibration current ICAL into the measurement circuit 404 via the sense node NS. The calibration current ICAL may vary over time so as to illuminate the signal path over a full range of signal levels. For example, the calibration current ICAL may step up on current over several steps which correspond to a dynamic range of the ADC 406. Alternatively, the calibration current ICAL may be continuously swept through a range of currents.

At step 706, the control module 412 may measure the output signal Q output from the compensation circuit 408. The output signal Q may be measured for each of a set of magnitudes of calibration current ICAL.

At step 708, based on the injected calibration current ICAL and the output signal Q, a compensation C to be applied by the compensation circuit 408 may be derived. For example, polynomial coefficients may be calculated for a polynomial filter to be implemented by compensation circuit 408. The step of determining the compensation C to be applied by the compensation circuit 408 may, in some embodiments, involve calculating an inverse polynomial using a least squares method, such as a weighted least squares method. A single polynomial calculation may be performed for the entire range of calibration current ICAL i.e. a single polynomial for the entire current range. Alternatively, multiple inverse polynomial calculations may be carried out, each for a different subset of the range of calibration current ICAL. It has been found that determining two inverse polynomials, each for half of the range of calibration current ICAL provides more accurate estimate than using a single inverse polynomial. This is particularly the case where the calibration current ICAL contains both positive and negative current values. In this case, a first inverse polynomial estimation may be performed for positive values of calibration current ICAL and a second inverse polynomial estimation may be performed for negative values of calibration current ICAL. It will be appreciated that care must be taken to reduce instances of discontinuities between first and second polynomials (for respective positive and negative values) of the calibration current ICAL. Such discontinuities may be managed by removing DC offset using any auto zero routine known in the art. With DC offset removed, the lowers power coefficient in each polynomial can be fixed to zero, which in turn may remove any discontinuity at the zero crossing point (i.e. 0 nA). Additionally or alternatively, one or more constraints may be applied to ensure a smooth transition at the zero crossing point, should a discontinuity be present.

At step 710, one or more parameters of the compensation circuit 408 may be adjusted based on the determined compensation C at step 708. For example, one or more filter parameters (e.g. coefficients) of filter(s) implemented by the compensation circuit 408 may be adjusted to implement the desired compensation C. In the situation where one or more inverse polynomials are estimated at step 710, these inverse polynomials may be applied by the compensation circuit 408 by adjusting such filter parameters. In one example, the signal path may be isolated and a full set of new polynomial coefficients may be determined and implemented using the compensation circuit. Alternatively, filter parameters (e.g. calibration coefficients) may be refined based on one or more expected and/or measured results.

Optionally, at step 712, if the working electrode WE was previously decoupled from the sense node at step 702, the working electrode WE may be recoupled to the sense node NS and decoupled from the bias voltage VBIAS3. Like the steps taken at step 702, the switching of the working electrode WE from the bias voltage VBIAS3 to the sense node NS preferably operates as a make-before-break switch network, to maintain the working electrode voltage VWE substantially constant during the transition.

The circuit 400 may then be operated in a measurement mode in which a characteristic of the cell 100 is determined based on the output signal Q. Since compensation circuit 408 is now calibrated, the output signal Q may be substantially free from error due to non-linearities in the measurement circuit 404 and/or the ADC 406.

Figure 5:
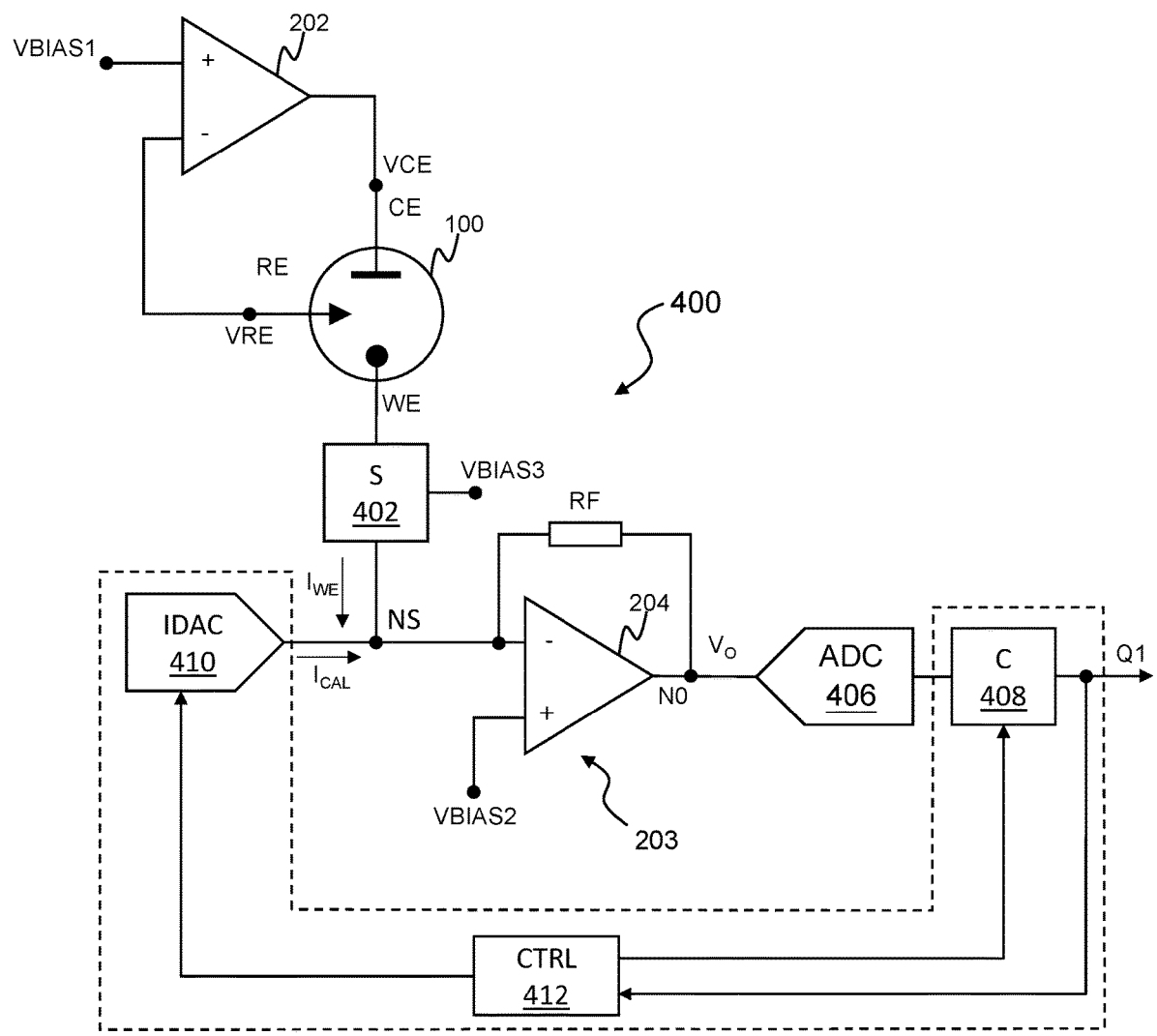
FIG. 5 is a schematic diagram of a measurement circuit for measuring characteristics of an electrochemical cell.
Figure 6:
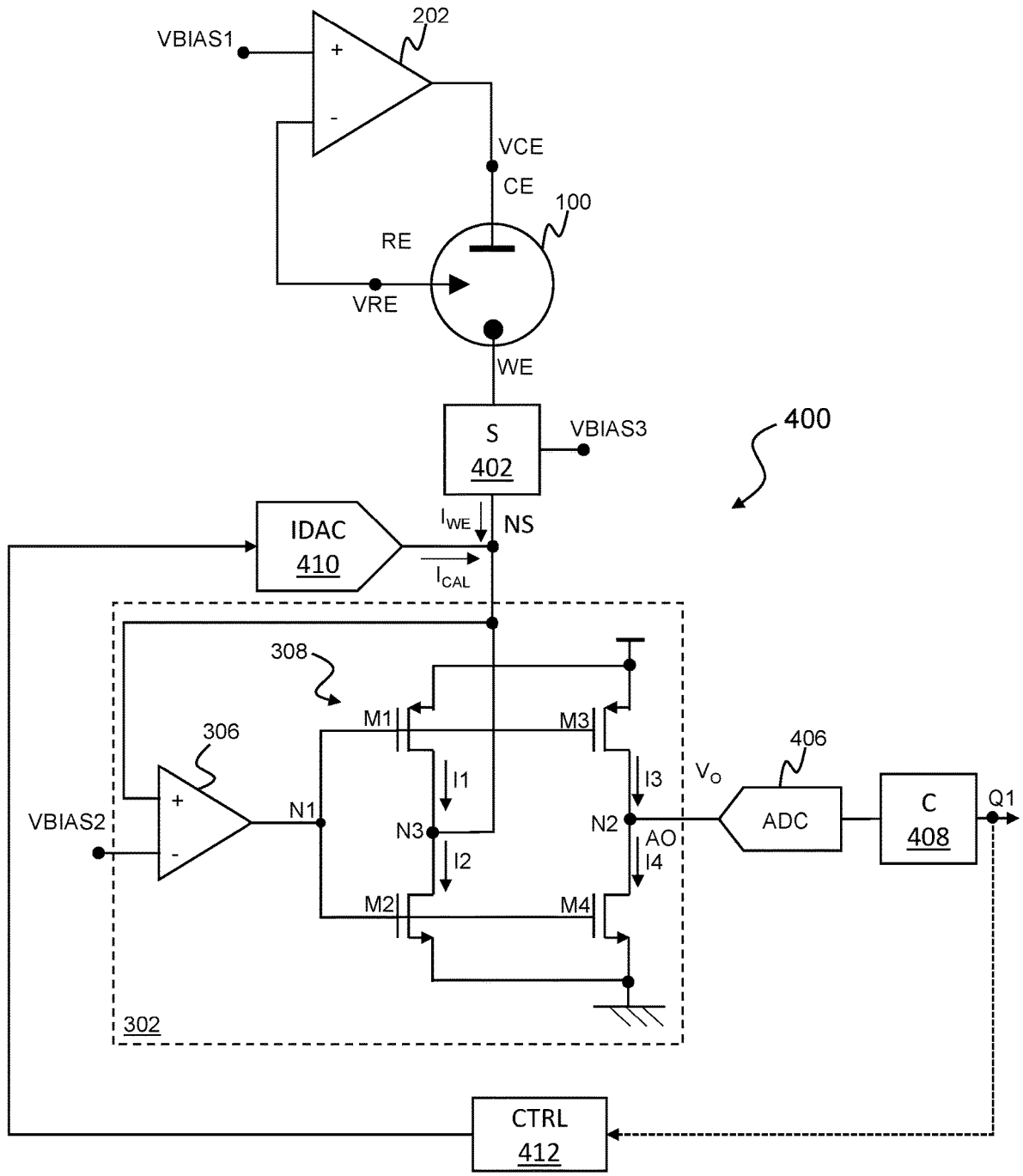
FIG. 6 is a schematic diagram of a measurement circuit for measuring characteristics of an electrochemical cell.

In the above embodiments described with reference to FIGS. 4 to 6, the entire signal path comprising the measurement circuit 404 and the ADC 406 are compensated using a single adaptive loop comprising the compensation circuit 408, the control module 412 and the IDAC 410. It will be appreciated however, that the measurement circuit 404 and the ADC 406 may be subject to different effects. As such, it may be preferably to compensate for non-linearities associated with the measurement circuit 404 separately from the ADC 406.

Figure 8:
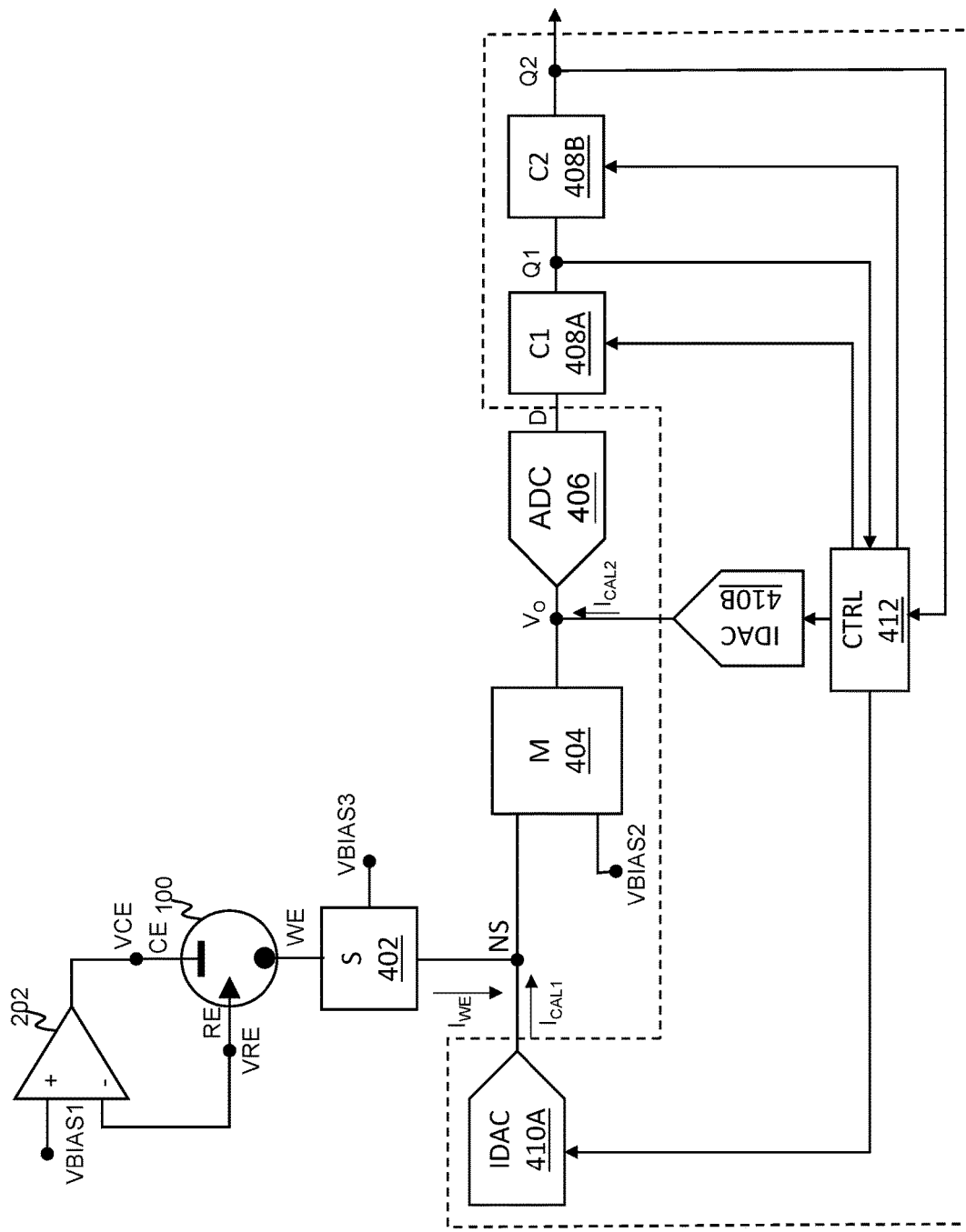
FIG. 8 illustrates an example drive and measurement circuit which is a variation of the circuit shown in FIG. 4.

FIG. 8 illustrates an example drive and measurement circuit 800 which is a variation of the circuit 400 shown in FIG. 4. Like parts of the circuits 400, 800 have been given like numbering.

In the embodiment shown in FIG. 8, the compensation circuit 408 has been replaced with first and second compensation circuits 408A, 408B respectively configured to apply a first compensation C1 and a second compensation C2. The first compensation circuit 408A is configured to apply a first compensation C1 to the digital representation D output from the ADC 406 and output a first compensated output signal Q1. The second compensation circuit 408B is configured to receive the first compensated output signal Q1 and apply the second compensation C2 and output a second compensated output signal Q2. Each of the first and second compensation circuits 408A, 408B may operate in a similar manner to the compensation circuit 408 described above with reference to FIG. 4. Thus, it will be appreciated that the first and second compensation circuits 408A, 408B may be configured to implement the sample or different types of compensation.

The single IDAC 410 in the circuit 400 has been replaced in the circuit 800 with first and second IDACs 410A, 410B. The first IDAC 410A is configured to inject a first calibration current ICAL1 at the sense node NS. The second IDAC 410B is configured to inject a second calibration current ICAL2 at the output of the measurement circuit 404, i.e. the input of the ADC 406.

The control module 412 of the circuit 800 is configured to control the first and second IDACs 410A, 410B and monitor the first and second compensated output signals Q1, Q2 output from respective first and second compensation circuits 408A, 408B. Thus a first (outer) adaptive loop may be formed around the measurement circuit 404 using the second compensation circuit 408B, and a second (inner) adaptive loop may be formed around the ADC 406 using the first compensation circuit 408A.

As with the circuit 400 shown in FIG. 4, the circuit 800 may be operable in multiple modes. However, instead of a single calibration mode involving a single adaptive loop as described with reference to the circuit 400 in FIG. 4, the circuit 800 shown in FIG. 8 may be operable in a measurement mode as well as two (first and second) calibration modes.

In the measurement mode, a characteristic of the cell 100 is determined based on the output signal Q2 to which compensation has been applied to account for non-linearities in each of the measurement circuit 404 and the ADC 406.

In the first calibration mode, the first IDAC 410A may be controlled by the control module 412 to output a first calibration current ICAL1 at the sense node to characterize non-linearities in the measurement circuit 404 using a first (outer) loop comprising the second compensation circuit 408B. The control module 412 may monitor the second compensated output signal Q2 at the output of the second compensation circuit 408B during application of the first calibration current ICAL1 at the sense node. The process for determining compensation parameters for the second calibration circuit 408B may be similar to the process 700 described with reference to FIG. 7.

In the second calibration mode, the second IDAC 410B may be controlled by the control module 412 to output a second calibration current ICAL2 at the input of the ADC 406 to characterize non-linearities in the ADC 406 using a second (inner) loop comprising the first compensation circuit 408A. The control module 412 may monitor the first compensated output signal Q1 at the output of the first compensation circuit 408A during application of the second calibration current ICAL2 at the sense node. The process for determining compensation parameters for the first calibration circuit 408B may be similar to the process 700 described with reference to FIG. 7.

It will be appreciated that the switching circuitry 402 may be configured to couple the working electrode to the bias voltage VBIAS3 and decouple the working electrode from the sense node NS during the first and second calibration modes.

It will be appreciated that by individually providing multiple loops for adapting compensation for non-linearities in each of the measurement circuit 404 and the ADC 406, a more accurate estimate of non-linearities can be obtained which may lead to an improved estimate of characteristics of the cell 100 during the measurement mode.

It will be appreciated that several variations of the circuit 800 shown in FIG. 8 are possible without departing from the scope of the present disclosure. For example, instead of providing separate first and second IDACs 410A, 410B, a single IDAC may be provided which may be multiplexed to each of the sense node NS and the input of the ADC 406. The control module 412 may be configured to control a multiplexer to select which of the sense node NS and the ADC 406 input the IDAC is coupled to in order to apply respective first and second calibration currents ICAL1, ICAL2 for characterisation of the measurement circuit 404 and the ADC 406.

Embodiments are described above with reference to the cells 100 which comprises a single counter electrode CE and a single a working electrode WE. Embodiments of the disclosure are not, however, limited to having cells having only one counter electrode or only one working electrode. The concepts described herein are equally applicable to cells comprising multiple working electrodes or multiple counter electrodes. In doing so, such sensors may either provide redundancy or enable the sensing of multiple analytes in a single chip. This may be particularly advantageous in applications such as continuous glucose monitoring, where it may be desirable to measure concentrations of several analytes including but not limited to two or more of glucose, ketones, oxygen, lactate, and the like.

Figure 9:
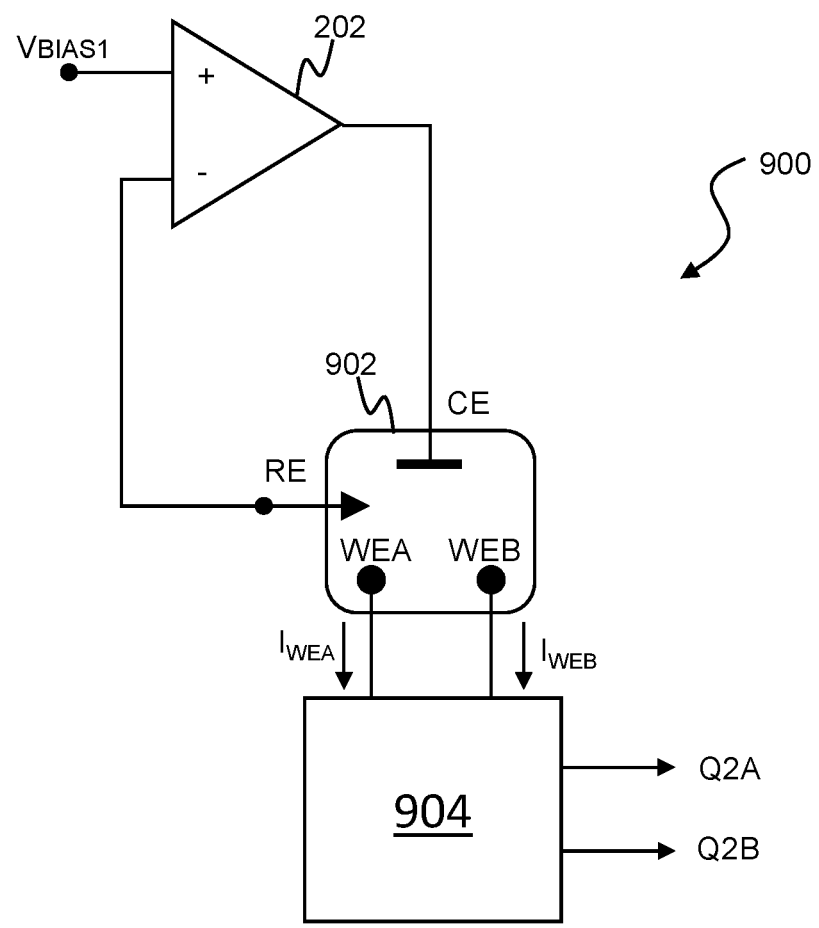
FIG. 9 illustrates an example drive and measurement circuit.

FIG. 9 illustrates an example drive and measurement circuit 900. Where like parts have been given like numbering. In the circuit 900, an electrochemical cell 902 comprising first and second working electrode WEA, WEB, a counter electrode CE and a reference electrode RE. A measurement circuit 904 is provided which outputs a first digital output signal Q2A based on a current $I_{WEA}$ derived from the first working electrode WEA and outputs a second digital output signal Q2B based on a current $I_{WEB}$ derived from the second working electrode WEB. The measurement circuit 904 may, for example, comprise two processing channels, each processing channel implementing the circuitry shown in FIG. 4 or 8. Alternatively, the measurement circuit may be implemented using a single processing stream multiplexed by a multiplexer (not shown). For example, the measurement circuit 904 may comprise an ADC, such as the ADC 406 described above and a multiplexer configured to selectively couple either of the first and second working electrodes (WEA, WEB), optionally via a measurement circuit such as the measurement circuit 404 described above, to an input of the ADC. Alternatively, two-channel ADC may be provided, configured to convert signal derived from the first and second working electrodes WEA, WEB in parallel to respective first and second digital output signals.

In any case, the measurement circuit 904 may be operable to hold the first and second working electrodes WEA, WEB at different voltages. This may be particularly useful when measuring different analytes with the first and second working electrodes WEA, WEB. In some embodiments, calibration of the cell 902 may be performed in a single calibration step. For example, the measurement circuit 904 may comprise switching circuitry (not shown) such as the switching circuitry 402 of FIG. 4 which may be configured to hold the first and second working electrodes WEA, WEB at respective first and second bias voltages during calibration of the measurement circuit 904. The first and second working electrode voltages may be chosen so as to maintain the first and second working electrodes WEA, WEB at a substantially constant voltage during transitions between calibration and measurement modes of the circuit 900.

In the embodiments described herein, the electrochemical cells 100, 902 have been described in the form of an electrochemical sensor comprising counter and working electrodes CE, WE. For such sensors, the stimulus is typically a voltage, and the measured response is a current. It will be appreciated that embodiments of the present disclosure are not limited to such cells and extend to other types of cells, such as electrochemical cells acting as a power source (i.e. a battery). For batteries and the like, the driving stimulus of the cell is typically a current, and the measured response is a voltage.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware.

Note that as used herein the term module shall be used to refer to a functional unit or block which may be implemented at least partly by dedicated hardware components such as custom defined circuitry and/or at least partly be implemented by one or more software processors or appropriate code running on a suitable general purpose processor or the like. A module may itself comprise other modules or functional units. A module may be provided by multiple components or sub-modules which need not be co-located and could be provided on different integrated circuits and/or running on different processors.

Embodiments may be implemented in a host device, especially a portable and/or battery powered host device such as a mobile computing device for example a laptop or tablet computer, a games console, a remote control device, a home automation controller or a domestic appliance including a domestic temperature or lighting control system, a toy, a machine such as a robot, an audio player, a video player, or a mobile telephone for example a smartphone.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units

The invention claimed is:

1. Circuitry for processing an analyte signal obtained from an electrochemical cell, the circuitry comprising:
   measurement circuitry having a first measurement input coupled to a first electrode of the electrochemical cell, the measurement circuitry configured to convert the analyte signal at the first measurement input to a first analog output signal;
   an analog-to-digital converter (ADC) having an first ADC input for receiving the first analog output signal, the ADC configured to convert the first analog output signal to a first digital output signal at an ADC output;
   compensation circuitry configured in a measurement mode to:
      apply a first compensation to the first digital output signal to obtain a first compensated digital output signal, the first compensation to compensate for non-linearity in the ADC; and
      apply a second compensation to the first compensated digital output signal to obtain a second compensated digital output signal, the second compensation to compensate for non-linearity in the measurement circuitry;
   control circuitry configured in a calibration mode to:
      apply a first calibration signal at the first ADC input and adapt the first compensation based on the first calibration signal and the first compensated digital output signal; and
      apply a second calibration signal at the first electrode and adapt the second compensation based on the second calibration signal and the second compensated digital output signal.

2. Circuitry of claim 1, wherein the measurement circuitry comprises a transimpedance amplifier.

3. Circuitry of claim 2, wherein the transimpedance amplifier comprises:
   a gain stage coupled between the first electrode and the first ADC; and
   a feedback resistor coupled between the first electrode and the first ADC.

4. Circuitry of claim 1, wherein the measurement circuitry comprises a current conveyer.

5. Circuitry of claim 1, wherein, in the measurement mode, the first and second compensations are fixed.

6. Circuitry of claim 1, wherein the control circuitry comprises a first digital-to-analog converter (DAC) to apply the first calibration signal and a second DAC to apply the second calibration signal.

7. Circuitry of claim 6, wherein the first and second DACs are current DACs and wherein the first and second calibration signals are currents.

8. Circuitry of claim 6, wherein, in the measurement mode, the first and second DACs are disabled.

9. Circuitry of claim 1, further comprising:
   switching circuitry coupled between the first electrode and the first measurement input, the switching circuitry configured to selectively couple the first electrode to one of the first measurement input and a reference voltage,
   wherein, in the measurement mode, the switching circuitry is configured to couple the first electrode to the first measurement input; and
   wherein, in the calibration mode, the switching circuitry is configured to couple the first electrode to the reference voltage, the reference voltage set to maintain a substantially constant voltage at the first electrode during transition between the measurement mode and the calibration mode.

10. Circuitry of claim 1, wherein the control circuitry is configured to:
    apply the first calibration signal at the first ADC input and adapt the first compensation based on the first calibration signal and the first compensated digital output signal in a first calibration phase; and
    apply the second calibration signal at the first electrode and adapt the second compensation based on the second calibration signal and the second compensated digital output signal, the first and second calibration phases occurring at different times.

11. A system comprising:
    the circuitry of claim 1;
    the electrochemical cell.

12. The system of claim 11, wherein:
    the electrochemical cell comprises a counter electrode and a first working electrode; and
    the first electrode is a first working electrode of the electrochemical cell.

13. The system of claim 12, wherein the electrochemical cell comprises a second working electrode.

14. The system of claim 11, wherein the electrochemical cell comprises an anode and a cathode, wherein the first electrode is the cathode.

15. An electronic device comprising the circuitry of claim 1, wherein the electronic device comprises one of an analyte monitoring device or an analyte sensing device, a battery, a battery monitoring device, a mobile computing device, a laptop computer, a tablet computer, a games console, a remote control device, a home automation controller or a domestic appliance, a toy, a robot, an audio player, a video player, or a mobile telephone, and a smartphone.

16. Circuitry for characterising an electrochemical cell, the circuitry comprising:
    measurement circuitry;
    switching circuitry configured to selectively couple the measurement circuitry to respective first and second working electrodes of the electrochemical cell; and
    calibration circuitry;
    wherein, in a first mode, the switching circuitry is configured to hold the first and second working electrodes at respective first and second bias voltages and calibration circuitry is configured to calibrate the measurement circuitry,
    wherein, in a second mode, the switching circuitry is configured to hold the first working electrode at the first bias voltage and couple the second working electrode to the measurement circuitry, and the measurement circuitry is configured to measure a second signal at the second working electrode, and
    wherein, in a third mode, the switching circuitry is configured to hold the second working electrode at the second bias voltage and couple the first working electrode to the measurement circuitry, and the measurement circuitry is configured to measure the second signal at the second working electrode.

17. Circuitry of claim 16, wherein the measurement circuitry is configured to:
    convert the first signal at the first working electrode to a first analog output signal; and
    convert the second signal at the first working electrode to a second analog output signal.

18. Circuitry of claim 17, wherein the measurement circuitry comprises:
an analog-to-digital converter (ADC) having a first ADC input for receiving the first analog output signal and a second ADC input for receiving the second analog output signal,
the ADC configured to convert the first analog output signal to a first digital output signal and convert the second analog output signal to a second digital output signal.

19. Circuitry of claim 17, wherein the measurement circuitry comprises:
a multiplexer having:
a first input for receiving the first analog output signal;
a second input for receiving the second analog output signal; and
a multiplexer output for outputting the first analog output signal or the second analog output signal in response to a select signal; and
an analog-to-digital converter (ADC) having a first ADC input coupled to the multiplexer output, the ADC configured to convert the first analog output signal or the second analog output signal to a digital output signal.

20. A method of processing an analyte signal obtained from an electrochemical cell, the method comprising:
measurement circuitry having a first measurement input coupled to a first electrode of the electrochemical cell, the measurement circuitry configured to convert the analyte signal at a first electrode of the electrochemical cell to a first analog output signal;
convert the first analog output signal to a first digital output signal;
in a measurement mode to:
apply a first compensation to the first digital output signal to obtain a first compensated digital output signal, the first compensation to compensate for non-linearity in the ADC; and
apply a second compensation to the first compensated digital output signal to obtain a second compensated digital output signal, the second compensation to compensate for non-linearity in the measurement circuitry; and
in a calibration mode to:
apply a first calibration signal to the first analog output signal and adapt the first compensation based on the first calibration signal and the first compensated digital output signal; and
apply a second calibration signal to the first analog output signal and adapt the second compensation based on the second calibration signal and the second compensated digital output signal.

* * * * *